US006420476B1

United States Patent
Yamada et al.

(10) Patent No.: US 6,420,476 B1
(45) Date of Patent: *Jul. 16, 2002

(54) COMPOSITE DIELECTRIC MATERIAL COMPOSITION, AND FILM, SUBSTRATE, ELECTRONIC PART AND MOLDED ARTICLE PRODUCED THEREFROM

(75) Inventors: Toshiaki Yamada; Hiroaki Hasegawa; Yoshiyuki Yasukawa; Kenji Endou, all of Tokyo; Michihisa Yamada, Tokai; Yasuo Moriya, Tokyo; Tomiho Yamada, Obun; Tetsuya Itoh, Aichi, all of (JP)

(73) Assignees: TDK Corporation; NOF Corporation, both of Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/292,842

(22) Filed: Apr. 16, 1999

(30) Foreign Application Priority Data

Apr. 16, 1998 (JP) ............................................. 10-122978

(51) Int. Cl.⁷ ................................................. C08L 9/00

(52) U.S. Cl. ........................ 524/575; 524/430; 524/443; 524/444

(58) Field of Search ................................ 524/575, 430, 524/443, 444

(56) References Cited

U.S. PATENT DOCUMENTS

| | | | | | |
|---|---|---|---|---|---|
| 5,665,212 A | * | 9/1997 | Zhong et al. | ................ | 304/297 |
| 5,770,655 A | * | 6/1998 | Sagane et al. | ............... | 525/310 |
| 5,771,567 A | * | 6/1998 | Pierce et al. | .................. | 29/600 |
| 5,800,973 A | * | 9/1998 | Anderson et al. | ............ | 430/537 |

FOREIGN PATENT DOCUMENTS

| | | |
|---|---|---|
| JP | 50-69599 | 6/1975 |
| JP | 52-31272 | 8/1977 |
| JP | 63-164107 | 7/1988 |
| JP | 63-213563 | 9/1988 |
| JP | 6-192392 | 7/1994 |
| JP | 7-316238 | 12/1995 |
| JP | 07-316238 | 12/1995 |
| JP | 11-122012 | 4/1999 |

* cited by examiner

*Primary Examiner*—Peter D. Mulcahy
(74) *Attorney, Agent, or Firm*—Oblon, Spivak, McClelland, Maier & Neustadt, P.C.

(57) ABSTRACT

The invention has for its object to provide a composite dielectric material having any desired dielectric constant selectable from a relatively wide range in a high-frequency band and a low dielectric loss tangent, and a film, substrate, electronic part or molded or otherwise formed article using the same. To accomplish this object, there is provided a composite dielectric material composition comprising a heat-resistant, low-dielectric polymeric material that is a resin composition comprising one or two or more resins having a weight-average absolute molecular weight of at least 1,000, wherein the sum of carbon atoms and hydrogen atoms in said composition is at least 99%, and some or all resin molecules have a chemical bond therebetween, and a filler. A film, substrate, electronic part or molded or otherwise formed article is obtained using this composition.

17 Claims, 1 Drawing Sheet

COMPOSITE DIELECTRIC MATERIAL COMPOSITION, AND FILM, SUBSTRATE, ELECTRONIC PART AND MOLDED ARTICLE PRODUCED THEREFROM

BACKGROUND OF THE INVENTION

1. Art Field

The present invention relates to a composite dielectric material composition having a dielectric constant and low dielectric loss tangent suitable for use in high-frequency regions in particular, and a film, substrate, electronic part or molded or otherwise formed article using the same.

2. Background Art

To meet recent sharp increases in the quantity of information communications, there are growing demands for size and weight reductions, and fast operation of communications equipment and, hence, low-dielectric electrical insulating materials capable of meeting such demands are now in urgent need. In particular, the frequencies of radio waves used for hand-portable mobile communications such as earphones and digital portable phones, and satellite communications are in high-frequency bands covering from the MHz to GHz bands. Size reductions, and high-density packing of housings, substrates and elements are attempted on account of the rapid progress of communications equipment used as these communications means. For achieving size and weight reductions of communications equipment used in the high-frequency band region covering from the MHz to GHz bands, it is now required to develop an electrical insulating material with excellent high-frequency transmission characteristics combined with suitable low dielectric characteristics. In other words, a device circuit undergoes energy losses in the transmission process, which are called dielectric losses. The energy losses are not preferable because they are consumed as thermal energy in the device circuit, and discharged in the form of heat. In a low-frequency region the energy losses occur due to a dipole field change caused by dielectric polarization, and in a high-frequency region they occur due to ionic polarization and electronic polarization. The ratio between the energy consumed in a dielectric material and the energy built up in the dielectric material per cycle of an alternating field is referred to as a dielectric loss tangent, represented by $\tan \delta$. The dielectric loss is proportional to the product of a dielectric constant $\in$ and the dielectric loss tangent of material. Consequently, $\tan \delta$ increases with increasing frequency in the high-frequency region. In addition, the quantity of heat generated per unit area increases due to the high-density packing of electronic elements. To reduce the dielectric loss of a dielectric material as much as possible, therefore, it is required to use a material having a small value for $\tan \delta$. By use of a low-dielectric polymeric material having a reduced dielectric loss, the dielectric loss and the generation of heat due to electrical resistance are reduced so that the risk of signal malfunctions can be reduced. Materials having reduced transmission losses (energy losses) are thus strongly desired in the field of high-frequency communications. For materials electrically characterized by electrical insulation and a low-dielectric constant, it has been proposed so far in the art to use a diversity of materials such as thermoplastic resins, e.g., polyolefin, vinyl chloride resin and fluorine base resin, and thermosetting resins, e.g., unsaturated polyester resin, polyimide resin, epoxy resin, bis-maleimidotriazine resin (BT resin), crosslinkable polyphenylene oxide, and curable polyphenylene ether.

When materials having a low dielectric constant are used as an electronic part (element) material, however, polyolefins such as polyethylene and polypropylene, like those set forth in JP-B 52-31272, have a grave disadvantage that their heat resistance is low although they have excellent insulation resistance as electrical properites. This is because they have a covalent bond such as a C—C bond, and are free of a large polar group. For this reason, their electrical properties (dielectric loss, dielectric constant, etc.) become worse when they are used at high temperatures, Thus, such polyolefins are not preferable for use as an insulating film (layer) for capacitors, etc. The polyethylene and polypropylene, once they have been formed into film, are coated and bonded onto a conductive material using an adhesive agent. However, this method does not only involve a complicated process but also offers some problems in view of coating, for instance, because it is very difficult to make the thickness of the film thin.

The vinyl chloride resin has high insulation resistance and excellent chemical resistance and fire retardance, but it has the demerits of lacking-heat resistance as in the case of polyolefins, and having large dielectric losses as well.

Polymers containing a fluorine atom in their molecular chains, like vinylidene fluoride resin, trifluoroethylene resin, and perfluoroethylene resin, are excellent in terms of electrical properties (low dielectric constant, low-dielectric loss), heat resistance and chemical stability. However, one difficulty with such polymers is that, unlike thermoplastic resins, they cannot be heat-treated into formed articles or films due to their poor formability, and their poor ability to form coatings. Another disadvantage is that some added cost is needed for forming the polymers into devices. Yet another disadvantage is that the field to which the polymers are applicable is limited due to their low transparency. Such low-dielectric polymeric materials for general purpose use as mentioned above are all insufficient in terms of heat resistance because their allowable maximum temperature is below 130° C. and, hence, they are classified as an insulating material for electrical equipment into heat resistance class B or lower according to JIS-C4003.

On the other hand, the thermosetting resins such as epoxy resin, polyphenylene ether (PPE), unsaturated polyester resin, and phenolic resin are mentioned for resins having relatively good heat resistance. As disclosed in JP-A 6-192392, the epoxy resin conforms to performance requirements regarding insulation resistance, dielectric breakdown strength, and heat-resistant temperature. However, no satisfactory properties are obtained because of a relatively high dielectric constant of 3 or greater. The epoxy resin has another demerit of being poor in the ability to form thin films. In addition, a curable modified PPO resin composition is known, which composition is obtained by blending polyphenylene oxide resin (PPO) with polyfunctional cyanic acid ester resins and other resins, and adding a radical polymerization initiator to the blend for preliminary reactions. However, this resin, too, fail to reduce the dielectric constant to satisfactory levels.

With a view to improving the epoxy resin having poor heat resistance, combinations of the epoxy resin with, for instance, phenol-novolak resin, and vinyltriazine resin have been under investigation. However, a grave problem with these combinations is some significant drop of the dynamic properties of the resulting films.

For the purposes of solving the above problems while the electrical properties are maintained, and specifically introducing improvements in the processability on heating, and close contact with or adhesion to copper or other metal conductors (layers), proposals have been put forward for copolymers of branched cyclo-ring amorphous fluoropolymer, and perfluoroethylene monomer with other monomers. However, although these copolymers may satisfy electrical properties such as dielectric constant, and dielectric loss tangent, yet their heat resistance remains worse under the influence of a methylene chain present in the high-molecular main chain. Never until now, thus, is there obtained any resin that can come in close contact with device substrates.

Among performance requirements for a low-dielectric-constant material excellent in dielectric properties and insulation resistance, there is heat resistance. That is, such a material can stand up well to a 120-second heating at a temperature of at least 260° C. because a soldering step is always incorporated in a device fabrication process. Stated otherwise, the material should also be excellent in heat resistance, chemical stability such as alkali resistance, humidity resistance, and mechanical properties. Thus, the range of high-molecular materials capable of meeting such requirements is further limited. For instance, polyimide, polyether sulfone, polyphenylene sulfide, polysulfone, thermosetting polyphenylene ether (PPE), and polyethylene terephthalate are only known in the art. While these high-molecular materials are capable of forming thin films and coming in close contact with substrates, it is found that they are somewhat awkward.

With recent diverse progresses in electronic technologies, insulating materials used for electronic equipment, too, are being required to have diverse performances. Printed wiring boards in particular are used in a very wide range of applications and, hence, substrates thereof must now meet more and more requirements. Under such situations, there are also numerous requirements for dielectric properties.

For the purposes of fast transmission, high-characteristic impedance, thickness reductions of wiring boards, and crosstalk reductions in printed wiring boards, low-dielectric-constant wiring boards have been so far under development. For the purposes of forming delaying circuits on high-frequency circuit, microwave circuit or other wiring boards, achieving characteristic impedance matching in low-impedance circuit wiring boards, making wiring patterns fine, incorporating into hybrid circuits an element in which a substance itself has a capacitor effect, etc., on the other hand, high-dielectric-constant substrates are now required.

With recent progresses in information communication systems, the frequencies of radio waves used for hand-portable mobile communications such as earphones and digital portable phones, and satellite communications are in high-frequency bands covering from the MHz to GHz bands. Size reductions, and high-density packing of housings, substrates and elements are attempted on account of the rapid progress of communications equipment used as these communications means. Equivalent requirements are imposed on antennas used therewith. Thus, planar antennas used as high-frequency antennas are now fabricated by forming micro strip lines on dielectric substrates.

For the dielectric substrates for planar antennas, materials such as Teflon ($\in r$=2.2 to 2.7/1 GHz) or BT resin ($\in r$=3.3 to 3.5/1 GHz) having relatively low relative dielectric constants ($\in r$) have been used. With these materials, however, it is difficult to obtain high reliability because it is difficult to achieve size reductions and because the materials are susceptible to deformation due to heat and dielectric constant ($\in r$) changes due to temperature.

To reduce the size of planar antennas, therefore, the dielectric substrate used to this end must have such properties as high dielectric constant and low losses.

For this purpose, it has been proposed to use a substrate having a high dielectric constant, which is fabricated by adding ceramic powders having a high dielectric constant to resins for multilayered sheets or printed wiring boards, e.g., phenol resin or epoxy resin or low-dielectric-constant resins such as fluorine resin or polyphenylene ether resin to impregnate a glass cloth or glass unwoven cloth with the ceramic powders, drying the cloth together with the powders to form a prepreg, and laminating such prepregs together.

However, it is impossible to achieve dielectric loss tangent reductions only by adding the high-frequency ceramics having a high dielectric constant to general thermosetting resins such as conventional phenol or epoxy resin for multilayered sheets or printed wiring boards.

When a filler having a high dielectric constant is added to resins having a low dielectric constant, e.g., fluorine resin or polyphenylene ether resin, there is a dielectric loss tangent decrease. To make the dielectric constant high, however, it is required to increase the amount of the filler added, resulting in problems such as drops of the ability of the multilayered sheet to be drilled or cut, and large dimensional changes of the multilayered sheet upon drilling or cutting.

SUMMARY OF THE INVENTION

One object of the present invention is to provide a heat-resistance, low-dielectric-constant resin composition which possesses high heat resistance and a low coefficient of linear expansion, and is excellent in close contact with or adhesion to a metal conductor layer, capable of forming a thin film with a dielectric constant being selected from a relatively wide range, low in terms of dielectric loss, and excellent in insulating properties, and weather resistance and processability as well, and a film, substrate, electronic part or molded or otherwise formed article using the same.

Such objects are achieved by the inventions as defined below.

(1) A composite dielectric material composition comprising a heat-resistant, low-dielectric polymeric material (I) that is a resin composition comprising one or two or more resins having a weight-average absolute molecular weight of at least 1,000, wherein the sum of carbon atoms and hydrogen atoms in said composition is at least 99%, and some or all resin molecules have a chemical bond therebetween, and a filler (II).

(2) The composite dielectric material composition according to (1), wherein said chemical bond in said heat-resistant, low-dielectric polymeric material is at least one bond selected from crosslinking, block polymerization, and graft polymerization.

(3) The composite dielectric material composition according to (1), wherein said heat-resistant, low-dielectric polymeric material is a copolymer in which a non-polar α-olefin base (co)polymer segment and/or a non-polar conjugated diene base (co)polymer segment are chemically combined with a vinyl aromatic (co)polymer segment, and is a thermoplastic resin which shows a multi-phase structure wherein a dispersion phase formed by one segment is finely dispersed in a continuous phase formed by another segment.

(4) The composite dielectric material composition according to (3), which is a copolymer with said non-polar α-olefin base (co)polymer segment chemically combined with said vinyl aromatic (co)polymer segment.

(5) The composite dielectric material composition according to (3), wherein said vinyl aromatic (co)polymer segment is a vinyl aromatic copolymer segment containing a monomer of divinylbenzene.

(6) The composite dielectric material composition according to (4), wherein said copolymer in which sand non-polar α-olefin base (co)polymer segment and/or said non-polar conjugated diene base (co)polymer segment are chemically combined with said vinyl aromatic (co)polymer segment is a copolymer chemically bonded by graft polymerization.

(7) The composite dielectric material composition according to (1), wherein said heat-resistant, low-dielectric polymeric material further comprises a non-polar α-olefin base (co)polymer containing a monomer of 4-methylpentene-1.

(8) The composite dielectric material composition according to (1), which has a dielectric constant of at least 1.0 and a Q value of at least 100 in a high-frequency band of at least 1 MHz.

(9) The composite dielectric material composition according to (1), wherein said filler is in a fibrous state.

(10) The composite dielectric material composition according to (1), wherein said filler is a non-fibrous state.

(11) The composite dielectric material composition according to (1), wherein said filler is a high-frequency ceramic dielectric material.

(12) The composite dielectric material composition according to (11), wherein said high-frequency ceramic dielectric material is a titanium-barium-neodymium base material and/or a lead-calcium base material, and accounts for 50 to 95% by weight of said composite dielectric material composition.

(13) A film of at least 20 μm in thickness, which is obtained using the composite dielectric material composition according to (1).

(14) A substrate obtained by lamination of films, each according to (13).

(15) A substrate obtained by coating a surface of a metal sheet with the composite dielectric material composition according to (1).

(16) The film according to (13), which is used in a high-frequency band of at least 1 MHz.

(17) The substrate according to (14), which is used in a high-frequency band of at least 1 MHz.

(18) An electronic part, which is obtained using the composite dielectric material composition according to (1) and used in a high-frequency band of at least 1 MHz.

(19) An article obtained by forming the composite dielectric material composition according to (1) into a given shape.

EXPLANATION OF THE PREFERRED EMBODIMENTS

The present invention will now be explained in great detail.

The composite dielectric material composition of the invention comprises a heat-resistant, low-dielectric polymeric material that is a resin composition comprising one or two or more resins having a weight-average absolute molecular weight of at least 1,000, wherein the sum of carbon atoms and hydrogen atoms in said composition is at least 99%, and some or all resin molecules have a chemical bond therebetween, and a filler. The composite dielectric material composition made up as mentioned above can have a dielectric constant selected from a wide range in a high-frequency band and satisfactory electrical properties, i.e., satisfactory low dielectric loss tangent. When the composite dielectric material composition is composed solely of the heat-resistant, low-dielectric polymeric material, i.e., it is free of any filler, on the other hand, the range of dielectric constant control becomes narrow with an increase in the coefficient of linear expansion. In the invention, the heat-resistant, low-dielectric polymeric material comprising a resin composition having such a weight-average absolute molecular weight as mentioned above is used to ensure sufficient strength, sufficient close contact with or adhesion to metals, and sufficient heat resistance as well. In the invention, the sum of carbon atoms and hydrogen atoms should be at least 99% so as to convert existing chemical bonds into non-polar bonds so that low dielectric loss tangent can be easily obtained. Thus, a material having a weight-average absolute molecular weight of lower than 1,000 is poor in mechanical physical properties and heat resistance, and so is not suitable for the invention. On the contrary, it is not preferable that the sum of carbon atoms and oxygen atoms is less than 99%, and especially the number of polar molecule-forming atoms, e.g., oxygen atoms and nitrogen atoms, is larger than 1%. This is especially because the dielectric loss tangent becomes high.

The weight-average absolute molecular weight is more preferably 3,000 or greater, and even more preferably 5,000 or greater. Usually but not exclusively, the upper limit to the weight-average absolute molecular weight is about 10,000,000.

Hereinafter, the heat-resistant, low-dielectric polymeric material will be explained.

Examples of the resin forming the aforesaid polymeric material are homopolymers and copolymers (hereinafter often referred to as the (co)polymer) of non-polar α-olefins such as low-density polyethylene, ultra-low-density polyethylene, very-ultra-low-density polyethylene, high-density polyethylene, low-molecular-weight polyethylene, ultra-high-molecular-weight polyethylene, ethylene-propylene copolymer, polypropylene, polybutene, and poly (4-methylpentene), (co)polymers of monomers of conjugated dienes such as butadiene, isoprene, pentadiene, hexadiene, heptadiene, octadiene, phenylbutadiene, and diphenylbutadiene, and (co)polymers of monomers of carbon ring-containing vinyl such as styrene, nucleus-substituted styrene, e.g., methylstyrene, dimethylstyrene, ethylstyrene, isopropyl-styrene, and chlorostyrene, and α-substituted styrene, e.g., α-methystyrene, α-ethylstyrene, divinylbenzene, and vinyl-cyclohexane.

Polymers consisting of units of one single non-polar α-olefin monomer, one single conjugated diene monomer, and one single carbon ring-containing vinyl monomer are mainly exemplified above. However, it is acceptable to use copolymers obtained from monomers of different chemical species, for instance, a non-polar α-olefin monomer and a conjugated diene monomer, and a non-polar α-olefin monomer and a carbon ring-containing vinyl monomer.

Thus, the resin composition is comprised of these (co) polymers, i.e., one or two or more resins. However, it is then required that some or all resin molecules be chemically bonded with each other. In other words, some resin molecules may be in a mixed state. Since at least some resin molecules are chemically bonded with each other, the resin composition, when used as a heat-resistant, low-dielectric polymeric material, ensures sufficient strength, sufficient close contact with or adhesion to metals, and sufficient heat resistance as well. However, the resin composition, when it is only in a mixed state and has no chemical bond, is insufficient in terms of heat resistance and mechanical physical properties.

Although not critical, the form of the chemical bond in the present invention may be a crosslinked structure, a block structure or a graft structure obtained by known methods. Preferred embodiments of graft, and block structures will be given later. For instance, it is desired that the cross-linked structure be obtained by heating preferably at a temperature of the order of 50 to 300° C. Crosslinking may also be achieved as by electron beam irradiation.

The presence or absence of the chemical bond according to the present invention may be identified by finding the degree of crosslinking, and graft efficiency, etc. in the case of the graft structure. This may also be confirmed by transmission electron microscope (TEM) photographs or scanning electron microscope (SEM) photographs. From, for instance, a TEM photograph taken of an $RuO_2$-stained super-thin fragment of the graft copolymer, it is found that one (co)polymer segment, in the form of fine particles of approximately up to 10 μm, and more specifically 0.01 to 10 μm, is dispersed in another (co)polymer segment. In a simple mixture (polymer blend), on the contrary, both the polymers have no compatibility with each other unlike a graft copolymer; that is, dispersed particles become large.

A first preferred embodiment of the resin composition of the invention is a thermoplastic resin that is a copolymer in which a non-polar α-olefin base (co)polymer segment is chemically combined with a vinyl aromatic (co)polymer segment, and which shows a multi-phase structure in which a dispersion phase formed by one segment is finely dispersed in a continuous phase formed by another segment.

The non-polar α-olefin base (co)polymer that is one segment in the thermoplastic resin showing such a specific multi-phase structure as explained above should be either a homopolymer of units of one single non-polar α-olefin monomer or a copolymer of two or more non-polar α-olefin monomers, obtainable by high-pressure radical polymerization, moderate- or low-pressure ion polymerization, etc. Copolymers with a polar vinyl monomer are not preferable because of a dielectric loss tangent increase. For instance, ethylene, propylene, butene-1, hexene-1, octene-1,4-methylpentene-1 are mentioned for the non-polar α-olefin monomer in the aforesaid polymer. Among others, ethylene, propylene, butene-1,4-methylpentene-1 are preferred because of providing a non-polar α-olefin base polymer having a low-dielectric constant.

Examples of the aforesaid non-polar α-olefin (co)polymer are low-density polyethylene, ultra-low-density polyethylene, very-ultra-low-density polyethylene, high-density polyethylene, low-molecular-weight polyethylene, ultra-high-molecular-weight polyethylene, ethylene-propylene copolymer, polypropylene, polybutene, and poly (4-methylpentene). These non-polar α-olefin (co)polymers may be used alone or in combination of two or more.

Such non-polar α-olefin base (co)polymers should preferably have a weight-average absolute molecular weight of at least 1,000. The upper limit to this molecular weight is about 10,000,000 although not critical.

The vinyl aromatic (co)polymer that is one segment in the thermoplastic resin showing a specific multi-phase structure should be of non-polarity, and examples thereof are (co) polymers of monomers such as styrene, nucleus-substituted styrene, e.g., methylstyrene, dimethylstyrene, ethylstyrene, isopropylstyrene, and chlorostyrene, and α-substituted styrene, e.g., α-methylstyrene, α-ethylstyrene, and o-, m-, and p-divinylbenzene (preferably m-divinylbenzene and p-divinylbenzene, and more preferably p-divinylbenzene). The use of the non-polar polymers is because the introduction of a monomer with a polar functional group by copolymerization is not preferable due to a dielectric loss tangent increase. The vinyl aromatic polymers may be used alone or in combination of two or more.

Among the vinyl aromatic (co)polymers, a vinyl aromatic copolymer containing a monomer of divinylbenzene is preferred because of a heat resistance improvement. Examples of the divinylbenzene-containing vinyl aromatic copolymer are copolymers of monomers such as styrene, nucleus-substituted styrene, e.g., methylstyrene, dimethylstyrene, ethylstyrene, isopropylstyrene and chlorostyrene, and α-substituted styrene, e.g., α-methylstyrene and α-ethylstyrene with a divinylbenzene monomer.

Although the ratio between the divinylbenzene monomer and the vinyl aromatic monomer other than the divinylbenzene monomer is not critical, it is preferred that the divinylbenzene monomer accounts for at least 1% by weight of the copolymer so as to satisfy heat resistance to solder. While it is acceptable that the divinylbenzene monomer accounts for 100% by weight of the copolymer, yet it is preferred that the upper limit to the divinylbenzene content is 90% by weight in view of a synthesis problem.

Preferably, the vinyl aromatic (co)polymer that forms one segment in the invention has a weight-average absolute molecular weight of at least 1,000. While the upper limit thereto is not critical, it is usually about 10,000,000.

The thermoplastic resin having a specific multi-phase structure according to the present invention comprises 5 to 95% by weight, preferably 40 to 90% by weight, and most preferably 50 to 80% by weight of the non-polar α-olefin base (co)polymer segment. Stated otherwise, the vinyl base (co)polymer segment accounts for 95 to 5% by weight, preferably 60 to 10% by weight, and most preferably 50 to 20% by weight of the thermoplastic resin.

The thermoplastic resin having too low a non-polar α-olefin base polymer segment content is not preferable because the resultant formed article becomes brittle. Too much non-polar α-olefin base polymer segment is not again preferable because the close contact of the resin to metals becomes worse.

Such a thermoplastic resin should have a weight-average absolute molecular weight of at least 1,000. Although the upper limit thereto is not critical, it is usually about 10,000, 000 in view of formability.

Examples of the copolymer having a structure wherein the non-polar α-olefin base (co)polymer segment and vinyl base (co)polymer segment are chemically combined with each other are block copolymers, and graft copolymers, among which the graft copolymers are particularly preferred by reason of ease of preparation. Note that it is acceptable for these copolymers to include olefin base (co)polymers and vinyl base (co)polymers with the proviso that they do not deviate from the characteristic features of the block, and graft copolymers.

The thermoplastic resin having a specific multi-phase structure according to the present invention may be prepared by either chain transfer processes or ionizing radiation irradiation processes, all well known in the art. However, the most preference is given to the following process for the reasons that high graft efficiency prevents the occurrence of secondary coalescence due to heat so that high performance is effectively obtainable, and that the process is simple in itself.

A detailed account will now be given on how to prepare the graft copolymer that is the thermoplastic resin showing a specific multi-phase structure according to the present invention. One hundred (100) parts by weight of a non-polar α-olefin base (co)polymer are suspended in water. Apart from this, 5 to 400 parts by weight of a vinyl aromatic monomer are used to prepare a solution in which there are dissolved 0.1 to 10 parts by weight, per 100 parts by weight of the vinyl monomer, of one or a mixture of radically polymerizable organic peroxides represented by the following general formula (1) or (2) and 0.01 to 5 parts by weight, per a total of 100 parts by weight of the vinyl monomer and radically polymerizable organic peroxide, of a radical polymerization initiator that is decomposable at a temperature of 40 to 90° C. so as to obtain a half-life of 10 hours. The suspension, to which the solution is added, is heated under such conditions as to prevent substantial decomposition of the radical polymerization initiator, so that the non-polar α-olefin base (co)polymer is impregnated with the vinyl monomer, radically polymerizable organic peroxide and radical polymerization initiator. Then, the temperature of the aqueous suspension is elevated for the copolymerization of the vinyl monomer and radically polymerizable organic peroxide in the non-polar α-olefin (co)polymer, thereby obtaining a grafting precursor.

Then, the grafting precursor is milled together in a molten state at 100 to 300° C., so that the graft copolymer of the invention can be obtained. By milling a mixture of the grafting precursor with a separate olefin or vinyl base (co)polymer in a molten state, too, the graft copolymer may be obtained. The most preferable graft copolymer is obtained by milling together the grafting precursor.

General Formula (1)

In general formula (1), $R_1$ is a hydrogen atom or an alkyl group having 1 to 2 carbon atoms, $R_2$ is a hydrogen atom or a methyl group, $R_3$ and $R_4$ are each an alkyl group having 1 to 4 carbon atoms, $R_5$ is an alkyl group having 1 to 12 carbon atoms, a phenyl group, an alkyl-substituted phenyl group or a cycloalkyl group having 3 to 12 carbon atoms, and $m_1$ is 1 or 2.

General Formula (2)

In general formula (2), $R_6$ is a hydrogen atom or an alkyl group having 1 to 4 carbon atoms, $R_7$ is a hydrogen atom or a methyl group, $R_8$ and $R_9$ are each an alkyl group having 1 to 4 carbon atoms, $R_{10}$ is an alkyl group having 1 to 12 carbon atoms, a phenyl group, an alkyl-substituted phenyl group or a cycloalkyl group having 3 to 12 carbon atoms, and m2 is 0, 1 or 2.

Examples of the radically polymerizable organic peroxide represented by general formula (1) are t-butyl peroxyacryloyloxyethyl carbonate, t-amyl peroxyacryloyloxyethyl carbonate, t-hexyl peroxyacryloyloxyethyl carbonate, 1,1,3,3-tetramethylbutyl peroxyacryloyloxyethyl carbonate, cumyl peroxyacryloyloxyethyl carbonate, p-isopropylcumyl peroxyacryloyloxyethyl carbonate, t-butyl peroxymethacryloyloxyethyl carbonate, t-amyl peroxymethacryloyloxyethyl carbonate, t-hexyl peroxymethacryloyloxyethyl carbonate, 1,1,3,3-tetramethylbutyl peroxymethacryloyloxyethyl carbonate, cumyl peroxymethacryloyloxyethyl carbonate, p-isopropylcumyl peroxymethacryloyloxyethyl carbonate, t-butyl peroxymethacryloyloxyethyl carbonate, t-amyl peroxyacryloyloxyethyl carbonate, t-hexyl peroxyacryloyloxyethoxyethyl carbonate, 1,1,3,3-tetramethylbutyl peroxyacryloyloxyethoxyethyl carbonate, cumyl peroxyacryloyloxyethoxyethyl carbonate, p-isopropylcumyl peroxyacryloyloxyethoxyethyl carbonate, t-butyl peroxymethacryloyloxyethoxyethyl carbonate, t-amyl peroxymethacryloyloxyethoxyethyl carbonate, t-hexyl peroxymethacryloyloxyethoxyethyl carbonate, 1,1,3,3-tetramethylbutyl peroxymethacryloyloxyethoxyethyl carbonate, cumyl peroxymethacryloyloxyethoxyethyl carbonate, p-isopropylcumyl peroxymethacryloyloxyethoxyethyl carbonate, t-butyl peroxyacryloyloxyisopropyl carbonate, t-amyl peroxyacryloyloxyisopropyl carbonate, t-hexyl peroxyacryloyloxyisopropyl carbonate, 1,1,3,3-tetramethylbutyl peroxyacryloyloxyisopropyl carbonate, cumyl peroxyacryloyloxyisopropyl carbonate, p-isopropylcumyl peroxyacryloyloxyisopropyl carbonate, t-butyl peroxymethacryloyloxyisopropyl carbonate, t-amyl peroxylmethacryloyloxyisopropyl carbonate, 1,1,3,3-tetramethylbutyl peroxymethacryloyloxyisopropyl carbonate, cumyl peroxymethacryloyloxyisopropyl carbonate, and p-isopropylcumyl peroxymethacryloyloxyisopropyl carbonate.

Exemplary compounds represented by general formula (2) are t-butyl peroxyallyl carbonate, t-amyl peroxyallyl carbonate, t-hexyl peroxyallyl carbonate, 1,1,3,3-tetramethylbutyl peroxyallyl carbonate, p-menthane peroxylallyl carbonate, cumyl peroxylallyl carbonate, t-butyl peroxyallyl carbonate, t-amyl peroxymethallyl carbnoate, t-hexyl peroxymethallyl carbonate, 1,1,3,3-tetramethylbutyl peroxymethallyl carbonate, p-menthane peroxymethallyl carbonate, cumyl peroxymethallyl carbonate, t-butyl peroxyallyloxyethyl carbonate, t-amyl peroxyallyloxyethyl carbonate, t-hexyl peroxyallyloxyethyl carbonate, t-butyl peroxymethallyloxyethyl carbonate, t-amyl peroxymethallyloxyethyl carbonate, t-hexyl peroxymethallyloxyethyl carbonate, t-butyl peroxyallyloxyisopropyl carbonate, t-amyl peroxyallyloxyisopropyl carbonate, t-hexyl peroxyallyloxyisopropyl carbonate, t-butyl peroxymethallyloxyisopropyl carbonate, t-amyl peroxymethallyloxyisopropyl carbonate, and t-hexyl peroxymethallyloxyisopropyl cabonate.

Among others, preference is given to t-butyl peroxyacryloyloxyethyl carbonate, t-butyl peroxymethacryloyloxyethyl carbonate, t-butyl peroxyallyl carbonate, and t-butyl peroxymethallyl carbonate.

The graft efficiency of the thus obtained graft copolymer is 20 to 100% by weight. The graft efficiency may be determined from the per cent extraction by solvent of an ungrafted polymer.

The graft copolymer of the non-polar α-olefin base (co) polymer segment with the vinyl aromatic (co)polymer segment is preferred for the thermoplastic resin showing a specific multi-phase structure according to the present invention. For such a graft copolymer, however, it is acceptable to use a non-polar conjugated diene base (co)polymer segment instead of or in addition to the non-polar α-olefin base (co)polymer segment. The diene base polymers already mentioned may be used as this non-polar conjugated diene base polymer, and may be used alone or in combination of two or more.

It is to be noted that the non-polar α-olefin base (co)polymer in the above graft copolymer may contain a conjugated diene monomer and the non-polar conjugated diene base (co)polymer may contain an α-olefin monomer.

According to the present invention, it is also to be noted that the obtained graft copolymer may be crosslinked with divinylbenzene, etc. This is particularly preferable for a divinylbenzene monomer-free graft copolymer because its heat resistance is improved.

A block copolymer, too, may be used as the thermoplastic resin showing a specific multi-phase structure according to the present invention. For this block copolymer, for instance, a block copolymer of at least one (co)polymer of a vinyl aromatic monomer with at least one (co)polymer of a conjugated diene may be mentioned. The block copolymer may be of either a straight-chain type or a radial type wherein hard and soft segments are radially combined with each other. Also, the conjugated diene-containing (co)polymer may be either a random copolymer with a small amount of a vinyl aromatic monomer or a so-called tapered block copolymer wherein the content of the vinyl aromatic monomer in one block increases gradually.

No particular limitation is imposed on the structure of the block copolymer; that is, the block copolymer may be any of $(A\text{---}B)_n$, $(A\text{---}B)_n\text{---}A$, and $(A, B)_n\text{---}C$ types wherein A is a (co)polymer of the vinyl aromatic monomer, B is a (co)polymer of the conjugated diene, C is a coupling agent residue, and n is an integer of 1 or greater. It is to be noted that a conjugated diene moiety in the block copolymer may be hydrogenated for use.

For such a block copolymer, it is acceptable to use the aforesaid non-polar α-olefin base (co)polymer instead of or in addition to the aforesaid non-polar conjugated diene base (co)polymer. In this case, the non-polar conjugated diene base (co)polymer may contain an α-olefin monomer and the non-polar α-olefin base (co)polymer may contain a conjugated diene monomer. For the quantitative ratio between the segments in the block copolymer, and preferred embodiments thereof, reference is made to what is mentioned in connection with the graft copolymer.

To improve the heat resistance of the resin composition of the invention, and preferably the thermoplastic resin showing a specific multi-phase structure (and more preferably the graft copolymer), it is preferable to add thereto a non-polar α-olefin base (co)polymer including a monomer of 4-methylpentene-1. In some cases, the non-polar α-olefin base (co)polymer including a monomer of 4-methylpentene-1 may be contained in the polymeric material of the invention without making a chemical bond thereto. In such cases, such addition is not always required, but this is acceptable to obtain given properties.

In the present invention, it is preferable that the monomer of 4-methylpentene-1 accounts for at least 50% by weight of the non-polar α-olefin base (co)polymer. It is here to be noted that such a non-polar α-olefin base (co)polymer may further contain a conjugated diene monomer.

In particular, poly(4-methylpentene-1) that is a homopolymer consisting of units of one single monomer of 4-methylpentene-1 is preferable as the non-polar α-olefin base (co)polymer including the monomer of 4-methylpentene-1.

The poly(4-methylpentene-1) is preferably a crystalline poly(4-methylpentene-1) that is an isotactic poly(4-methylpentene-1) obtained by the polymerization of 4-methylpentene-1 which is a dimer of propylene, using a Ziegler-Natta catalyst, etc.

No particular limitation is placed on the ratio between poly(4-methylpentene-1) and the thermoplastic resin showing a specific multi-phase structure. To satisfy heat resistance and adhesion to metals, however, it is preferable to use poly(4-methylpentene-1) in an amount of 10 to 90% by weight. Too little poly(4-methylpentene-1) makes heat resistance to solder likely to become insufficient, and too much renders adhesion to metals likely to become insufficient. When the copolymer is used instead of poly(4-methylpentene-1), it may be added in an amount within the aforesaid range.

The resin composition of the invention (to which the non-polar α-olefin base (co)polymer containing the monomer of 4-methylpentene-1 may be added) has a softening point of 200 to 260° C. Sufficient heat resistance to solder may be obtained by making a suitable selection from such a range.

Referring hereto the electrical performance of the heat-resistant, low-dielectric polymeric material of the invention, the dielectric constant ($\in$) is at least 1, and especially 2.0 to 3.0, and the dielectric loss tangent (tan δ) is up to 0.01, and usually 0.0005 to 0.01, as measured in a high-frequency band of at least 60 MHz, and especially 60 MHz to 10 GHz.

It is here to be noted that the insulation resistivity of the polymeric material according to the present invention is at least 2 to $5\times10^{14}$ Ωcm, as represented by volume resistivity in a normal state. Further, the polymeric material of the invention has a high dielectric breakdown strength of at least 15 KV/mm, and especially 18 to 30 KV/mm. Furthermore, the polymeric material of the invention is excellent in heat resistance.

The polymeric materials may be used alone or in combination of two or more, and may be used primarily in a granulated form.

The filler (II) used herein may be available either in a fibrous form or in a non-fibrous form such as a powdery, sheet-like or granulate form. Exemplary fibrous fillers used herein include inorganic fibers such as glass fibers, alumina fibers, aluminum borate fibers, ceramic fibers, silicon carbide fibers, asbestos fibers, plaster fibers, brass fibers, stainless fibers, steel fibers, metal fibers, magnesium borate whiskers or their fibers, potassium titanate whiskers or their fibers, zinc oxide whiskers and boron whiskers, and fibrous fillers such as carbon fibers, aromatic polyamide fibers, aramid fibers and polyimide fibers. Exemplary non-fibrous fillers used herein include powdery, sheet-like or particulate fillers such as those of silicates, e.g., wollastonite, sericite, kaolin, mica, clay, bentonite, asbestos, talc, alumina silicate, pyrophyllite and montmorillonite; molybdenum disulfide; alumina; silicon chloride; zirconium oxide; iron oxide; carbonates, for instance, calcium carbonate, magnesium carbonate and dolomite; sulfates, for instance, calcium sulfate and barium sulfate; calcium polyphosphate; graphite; glass beads; glass microballoons;.glass flakes; boron nitride; silicone carbide; and silica. These fillers may be in a hollow form. In the present invention, it is acceptable to use a ceramic dielectric material as the filler.

These fillers may be used singly or in combination of two or more. If required, the fillers may be pretreated with a silane or titanium base coupling agent for use.

The fillers most preferable for the invention are glass fibers, and a ceramic dielectric material. Where a composite dielectric material having a low dielectric constant is needed, the glass fibers are used, and where a composite dielectric material having a high dielectric constant is needed, the ceramic dielectric material is used. Thus, the desired satisfactory electrical properties can be obtained.

Generally or not exclusively, glass fibers of the type available for the reinforcement of resins may be used in the invention. For instance, an appropriate selection may be made from long- or short-fiber types of chopped strands, chopped strand mats, continuous long-fiber mats, knitted, woven or otherwise formed glass clothes, and milled fibers.

Exemplary ceramic dielectric materials used herein include so-called ceramic dielectric materials such as titanium-barium-neodymium base composite oxides, lead-calcium base composite oxides, titanium dioxide base ceramics, barium titanate base ceramics, lead titanate base ceramics, strontium titanate base ceramics, calcium titanate base ceramics, bismuth titanate base ceramics, magnesium titanate base ceramics, and lead zirconate base ceramics as well as $GaWO_4$ base ceramics, $Ba(Mg, Nb)O_3$ base ceramics, $Ba(Mg, Ta)O_3$ base ceramics, $Ba(Co, Mg, Nb)O_3$ base ceramics, and $Ba(Co, Mg, Ta)O_3$ base ceramics. In particular, the titanium-barium-neodymium base materials, and lead-calcium base materials are preferred.

It is noted that by the aforesaid "titanium dioxide base ceramics" is intended a system which, from a standpoint of composition, is composed singly of titanium dioxide or comprises titanium oxide and a small amount of other additives, and which keeps the crystal structure of its main component titanium dioxide intact. The same also holds for other ceramic systems. Titanium dioxide is a substance represented by $TiO_2$, and may have various crystal structures. Of these substances, however, only the titanium dioxide having a rutile structure can be used as a ceramic dielectric material.

Such a ceramic dielectric material is obtained by firing according to known processes. Although no particular limitation is imposed on the firing conditions, it is yet preferable that the firing temperature is within the range of 850 to 1,400° C.

The ceramic dielectric material should preferably have a grain diameter distribution range of 1 $\mu$m to 200 $\mu$m inclusive in view of characteristics, and so should preferably have an average grain diameter of 90 to 150 $\mu$m. With too large a grain diameter, difficulty is involved in the uniform dispersion and mixing of the ceramic dielectric material in and with the polymeric dielectric material. With too small a grain diameter, on the other hand, the ceramic dielectric material cannot be mixed with the polymeric material. Even if this dielectric material can be somehow mixed with the polymeric material, there is then obtained a difficult-to-handle non-uniform mixture with an agglomeration of the ceramic dielectric material grains.

The filler (II) should account for preferably 1 to 95% by weight, more preferably 10 to 90% by weight, and most preferably 20 to 90% by weight of the composite dielectric material composition. It is here understood that when the ceramic dielectric material is used as the filler, the filler should preferably account for 50 to 95% by weight of the composite dielectric material composition. At such a filler content, not only are the desired dielectric constant and low dielectric loss tangent obtained, but it is also easy to obtain a resin composition well-balanced among heat resistance, coefficient of linear expansion, mechanical properties, close contact with metals, etc. At too small a content of filler (II), however, the coefficient of linear expansion is likely to increase. At too large a content of filler (II), formability becomes worse with an decrease in the mechanical properties.

Although, in the present invention, no particular limitation is imposed on how to mix the heat-resistant, low-dielectric polymeric material (I) with the filler (II), it is yet preferable to rely on the following processes (1) to (5).

(1) A process wherein given amounts of polymeric material (I) and filler (II) are blended together, and the blend is then hot kneaded or milled using equipment having a combined heating and milling function, for instance, a Banbury mixer, a heating kneader or roll, or a single- or twin-screw extruder.

(2) A process wherein filler (II) sandwiched between polymeric material sheets is supplied to a heated mold for compression shaping, and the molded article is removed from the mold after cooling.

(3) A process wherein a glass chopped fiber mat filler, a glass continuous long-fiber mat filler or a glass knitted or woven or otherwise formed cloth filler, to which a given amount of polymeric material powders is uniformly spread, is supplied to a mold for the same compression shaping as in (2).

(4) A stack of such cloth fillers as in (3) and polymeric material sheets is supplied to a mold for the same compression shaping as in (2).

(5) A mixture or stack of such a filler as in (1), (2), (3), and (4) and a polymeric material is guided between a pair of metal belts where the mixture or stack is continuously heated and cooled with the application of pressure, thereby obtaining a formed article in which the polymeric material and filler are combined together.

The most preference is given to a process wherein polymeric material (I) is supplied from a main hopper to a twin-screw extruder where filler (II) is charged and hot kneaded or milled with polymeric material (I) being subjected to hot kneading or milling.

The composite dielectric material to be used in actual applications may be obtained from the composite dielectric material composition of the invention by processes wherein the composite dielectric material composition is molded or otherwise formed into the desired shape (e.g., a thin film) by means of injection molding, heat pressing, etc. Alternatively, the composite dielectric material composition may be hot mixed with other thermoplastic resin by means of roll mixers, Banbury mixers, kneaders, and single- or twin-screw extruders, all having shear force, and the mixture may then be formed into any desired shape.

The composite dielectric material composition of the invention may be used in various forms inclusive of bulk or other given forms of formed articles or for film lamination purposes. Thus, the composite dielectric material composition of the invention may be used for various substrates for electronic equipment or parts (resonators, filters, capacitors, inductors, antennas, etc.) for high-frequency purposes, chip part forms of filters (e.g., C filters that are multilayer substrates) or resonators (e.g., tri-plate resonators), supports for dielectric resonators, housings or casings for various substrates or electronic parts (e.g., antenna rod housings), and electronic parts and their housings or casings.

In the field of substrates, the composite dielectric material composition of the invention is expected to be an alternative to glass, and epoxy substrates used so far in the art. More illustratively, the composite dielectric material composition may be applied to on-board substrates with parts mounted thereon, copper clad laminates, metal base/metal core substrates, etc., and to substrates with built-in circuits, antenna substrates (patch antennas) as well. Also, the composite dielectric material composition of the invention may be applied to on-board substrates for CPUs, which require heat-radiating treatments and are designed for use in a high-frequency band of at least 100 MHz.

For instance, a multilayer substrate may be obtained by interleaving a metal conductor layer that is a conductor film of copper or other metal between films and/or laminating the conductor film on the outermost layer, and thermally fusing the laminate together. In this case, too, improved close contact with the metal conductor film is obtained. Each film is obtained as by forming with a thickness of at least 50 $\mu$m, and with a thickness of 100 to 1,000 $\mu$m for such purposes. In other words, the film includes a film having a thickness tantamount to a substrate. The copper foil preferably used as the metal conductor film has a thickness of 18 to 35 $\mu$m. The total thickness of the substrate inclusive of the multilayer type is usually of the order of 0.1 to 1.6 mm. Occasionally, however, the substrate may have a larger thickness, and may be used with a thickness of about 10.0 mm.

For instance, the metal base/metal core substrate may be obtained by coating the surface of a metal sheet such as an iron, aluminum or copper sheet with a powder or film form of the resin composition by means of heat fusion, and laminating a metal conductor layer that is a metal conductor film of copper or the like on the outermost layer of the sheet, followed by heat fusion. In this case, the resin composition layer has usually a thickness of the order of 40 to 500 $\mu$m, the metal sheet has usually a thickness of the order of 0.3 to 1.5 mm, and the total thickness of the substrate is usually of the order of 0.3 mm to 1.6 mm. Optionally, however, the total thickness may exceed this upper limit.

To form the metal conductor layer according to a given pattern, it is acceptable that the metal conductor film is patterned to a given shape before close contact. However, when the metal conductor film is brought in close contact with an electrical insulating film by lamination, the metal conductor layer forming the outermost layer may be patterned, and then brought in close contact with the insulating film. Alternatively, the metal conductor layer may be etched out upon close contact with the insulating film, and then patterned.

The metal conductor layer may also be formed by such processes as vapor deposition, electroplating, and electroless plating.

As long as the advantages of the invention are achievable, the heat-resistant, low-dielectric resin composition of the invention may contain ordinary additives such as antioxidants, thermal stabilizers, lubricants, plasticizers, crystal-nucleating agents, ultraviolet inhibitors, coloring agents, and flame retardants. Additionally, the resin composition of the invention may contain resins such as polyethylene tetrafluoride, polyamide, polyether imide, polyamide-imide, polyimide, polycarbonate, polyether ketone, polyether-ether ketone, liquid crystal polymer, epoxy resin, phenol resin, ABS resin, polyester, divinylbenzyl resin, polyamide elastomer, polyester elastomer, and polyurethane.

The composite dielectric material composition of the invention may be formed into a given shape by molding, compression, and extrusion processes, already mentioned, as well as other suitable processes. That is, a suitable selection may be made from known processes depending on what purpose the composite dielectric material composition of the invention is used for. It is to be noted, however, that the chosen process should be able to form the composite dielectric material composition of the invention at low costs.

The composite dielectric material composition of the invention is preferably used in a high-frequency band of at least 1 MHz.

In a frequency band of at least 1 MHz, and especially in a high-frequency band of 60 MHz to 10 GHz, the composite dielectric material composition of the invention has a dielectric constant ($\in$) of at least 1, a dielectric loss tangent (tan $\delta$) of up to 0.01, and a Q value of at least 100, and especially 100 to 3,000. Thus, the composite dielectric material composition of the invention is suitable for use as an electrical insulating material having a low dielectric loss tangent. The composite dielectric material composition of the invention, because of including the filler therein, has sufficient mechanical properties and a low coefficient of linear expansion, and is improved in terms of heat conductivity as well. The insulation resistivity is $10^{13}$ $\Omega$cm to $10^{14}$ $\Omega$cm or greater, as represented by volume resistivity in a normal state, and the dielectric breakdown strength is sufficient as well. In addition, the heat resistance is excellent. By a choice of the starting materials for the heat-resistance, low-dielectric polymeric material (I) and filler (II), the heat resistance can be more improved so that the composite dielectric material composition can stand up well to soldering temperature. It is also possible to select the dielectric constant from a relatively wide range as desired. Thus, the composite dielectric material composition of the invention is preferably used not only for substrates and electronic parts, but also for housings and casings for which such treatments are needed.

EXAMPLE

The present invention will now be explained in further detail with reference to examples.

Set out below are first synthesis examples of the polymeric materials used in the following examples.

Synthesis Example 1

In a stainless autoclave of 5 liters in volume, 2.5 grams of a suspending agent or polyvinyl alcohol were dissolved in 2,500 grams of pure water. Seven hundred (700) grams of an olefinic polymer or polypropylene (made by Nippon Polyolefin Co., Ltd. and available under the trade name of J Alloy 150G) were placed in the solution for stirring and dispersion. Apart from this, 1.5 grams of a radical polymerization initiator or benzoyl peroxide and 9 grams of a radical-polymerizable organic peroxide or t-butylperoxymethacryloyloxyethyl carbonate were dissolved in 300 grams of an aromatic monomer or styrene to prepare another solution. This solution was charged in the autoclave for stirring with the first-mentioned solution. Then, the autoclave was brought up to a temperature of 60 to 65° C. for a two-hour stirring, thereby impregnating the polypropylene with the vinyl monomer containing the radical polymerization initiator and radical-polymerizable organic peroxide. Then, the autoclave was brought up to a temperature of 80 to 85° C. at which it was held for 7 hours to bring polymerization to completion. Subsequent filtration, washing with water and drying gave a grafting precursor (a).

Then, this grafting precursor (a) was extruded at 200° C. through a labo plastomill single-screw extruder (made by Toyo Seiki Seisakusho Co., Ltd.) for graft reaction, thereby obtaining a graft copolymer (A).

By analysis of this graft copolymer (A) by pyrolysis gas chromatography, it was found that the weight ratio of polypropylene (PP) and styrene (St) is 70:30.

It was also found that the graft efficiency of the styrene polymer segment is 50.1% by weight. It is here noted that the graft efficiency was determined by extracting an ungrafted styrene polymer with ethyl acetate in a Soxhlet extractor and finding the ratio of the ungrafted polymer to the grafted polymer. The weight-average absolute molecular weight of the resin was measured with a high-temperature GPC (made by Waters Co., Ltd.), and the carbon and hydrogen contents of the resin were determined by elemental analysis.

The resin particles were heat-pressed at 220° C. using a heat-pressing machine (made by Ueshima Machine Co., Ltd.) to prepare an electrical insulating material test piece of 10 cm×10 cm×0.1 cm. Apart from this, an injection molding machine was used to prepare test pieces of 13 mm×130 mm×6 mm as Izod impact test pieces and heat-resistance-to-solder test pieces. The obtained test pieces were used to make estimation of volume resistivity, dielectric breakdown strength, dielectric constant, dielectric loss tangent, heat resistance to solder, Izod impact strength, and adhesion to metal. Further, the obtained resin pellet was used for the measurement of water absorption. Furthermore, the resin pressed and heat-crosslinked by the heat-pressing machine was pulverized, and heated in xylene to find the degree of crosslinking from its solubility. The testing methods used are described below.

Insulation resistance testing (volume resistivity): JIS K 6911 (at a testing voltage of 500 V).

Dielectric breakdown testing (dielectric breakdown strength): JIS C 2110.

Dielectric constant testing: cavity resonator perturbation.

Dielectric loss tangent: cavity resonator perturbation.

For the estimation of heat resistance to solder, a test piece was immersed for 2 minutes in solder heated to 200° C., 230° C., and 260° C. to observe to what degree the test piece was deformed.

(Notched) Izod impact strength (referred to as Izod in the following tables, and expressed in kg·cm/cm² unit): JIS K7110.

For the determination of the coefficient of linear expansion, a test piece was measured in a preset temperature range of −30° C. to 130° C. along X-Y axes under a load of 2 grams.

For the estimation of adhesion to metal, a test piece was vacuum-deposited with aluminum, and then lightly rubbed with a cloth to investigate the adhesion of the thin film to metal.

Water absorption: according to ASTM D570.

For the estimation of the degree of crosslinking, 1 gram of pulverized resin was placed in 70 ml of xylene, heated to 120° C. under reflux, and stirred for 10 minutes. Thereafter, the solubility of the resin was observed.

For the estimation of formability, the moldability of an Izod impact test piece upon an injection molding machine and the formability thereof upon a pressing machine, and the moldability of film upon extrusion molding were investigated.

The results of each test are reported in Table 1 wherein the dielectric constant is given by electrostatic capacity of test piece as dielectric material/ electrostatic capacity of test piece in vacuum Regarding the heat resistance to solder, symbols ○, Δ, and × indicate "no deformation", "partial deformation", and "large deformation", respectively, and regarding the adhesion to metal, symbols ○, Δ, and × indicate "good", "partial peeling", and "total peeling", respectively.

Synthesis Example 2

In a stainless autoclave of 5 liters in volume, 2.5 grams of a suspending agent or polyvinyl alcohol were dissolved in 2,500 grams of pure water. Seven hundred (700) grams of an olefinic polymer or polypropylene (made by Nippon Polyolefin Co., Ltd. and available under the trade name of J Alloy 150G) were placed in the solution for stirring and dispersion. Apart from this, 1.5 grams of a radical polymerization initiator or benzoyl peroxide and 6 grams of a radical-polymerizable organic peroxide or t-butylperoxymethacryloyloxyethyl carbonate were dissolved in 100 grams of divinylbenzene and 200 grams of an aromatic monomer or styrene to prepare another solution. This solution was charged in the autoclave for stirring with the first-mentioned solution. Then, the autoclave was brought up to a temperature of 60 to 65° C. for a two-hour stirring, thereby impregnating the polypropylene with the vinyl monomer containing the radical polymerization initiator and radical-polymerizable organic peroxide. Then, the autoclave was brought up to a temperature of 80 to 85° C. at which it was held for 7 hours to bring polymerization to completion. Subsequent washing with water and drying gave a grafting precursor (b).

Then, this grafting precursor (b) was extruded at 200° C. through a labo plastomill single-screw extruder (made by Toyo Seiki Seisakusho Co., Ltd.) for graft reaction, thereby obtaining a graft copolymer (P).

By analysis of this graft copolymer (P) by pyrolysis gas chromatography, the weight ratio of polypropylene (PP), divinylbenzene (DVB) and styrene (St) was found to be 70:10:20.

The graft efficiency of the styrene polymer segment was found to be 50.1% by weight.

The thus obtained graft copolymer (P), too, was tested as in Synthesis Example 2. The results of each test are shown in Table 1.

TABLE 1

| Synthesis example | 1 | 2 |
|---|---|---|
| Graft copolymer | A | P |
| Compositions upon charging (% by weight) | PP:St 70:30 | PP:DVB:St 70:10:20 |
| Results of analysis of compositions (% by weight) | PP:St 70:30 | PP:DVB:St 70:10:20 |
| Ratio in the sum of atoms between carbon atoms and hydrogen atoms (%) | >99 | >99 |
| Volume resistivity (×10¹⁶ Ω · cm) | 3.1 | 3.0 |
| Dielectric breakdown strength (KV/mm) | 22 | 22 |
| Dielectric constant | | |
| 1 GHz | 2.27 | 2.37 |
| 2 GHz | 2.30 | 2.36 |
| 5 GHz | 2.30 | 2.33 |
| 10 GHz | 2.26 | 2.22 |
| Dielectric loss Tangent (×10⁻³) | | |
| 1 GHz | 0.84 | 0.53 |
| 2 GHz | 0.52 | 0.57 |
| 5 GHz | 0.49 | 0.62 |
| 10 GHz | 0.48 | 0.71 |
| Heat resistance to solder | | |
| 200° C. | ○ | ○ |
| 230° C. | ○ | ○ |
| 260° C. | Δ | ○ |
| Izod impact strength (Kg · cm/cm²) | 9 | 9 |
| Coefficient of linear expansion (ppm/° C.) | 240 | 170 |
| Adhesion to metal | ○ | ○ |
| Water absorption (%) | <0.03 | <0.03 |
| Formability | good | good |
| Degree of cross-linking (solubility) | SW | IS |

SW: swollen
IS: insoluble

Other polymers, too, may be synthesized according to the aforesaid method by a choice of the starting materials depending on the desired composition.

Example 1

The graft copolymer shown in Table 2 and a ceramic dielectric material were supplied through a metering feeder to a co-axial twin-screw extruder preset at a cylinder temperature of 230° C. and a screw diameter of 30 mm (PCM 30 Twin-Screw Extruder made by Ikegai Tekko Co., Ltd.) through which they were hot-milled to obtain a composite dielectric material composition. By analysis of this composite dielectric material composition by an ashing method, it was found that the weight ratio between the resin and the ceramics is as set out in Table 2 (the amount upon charging was the same as the amount upon analysis after preparation.

Polymer A of Synthesis Example 1 was used as the graft copolymer, and a titanium-barium-neodymium base ceramic material (having an average grain diameter of 120 μm and fired at 900° C.; called ceramics 1) as the ceramic dielectric material.

The composite dielectric material composition was hot-pressed at 220° C. and 300 Kg/cm$^2$ by a hot-pressing machine (Ueshima Machine Co., Ltd.), and then cut into samples of 1 mm×1 mm×100 mm (sample Nos. 1 to 3). Also, a sample with no ceramics added thereto (sample No. 4) and a sample having a varying thickness (sample No. 5) were prepared. The samples were measured by a purterbation method for dielectric constant (∈) and dielectric loss tangent (tan δ) at 1 GHz, 2 GHz and 5 GHz (and at 10 GHz for sample Nos. 4 and 5), thereby finding Q values. The heat resistance to solder was determined by immersing a test piece in solder heated to 200° C., and 230° C. for 2 minutes to observe to what degree the test piece was deformed. Symbols ○ and × indicate that no deformation was observed and deformation was observed, respectively.

The results are set out in Table 2.

Table 2 makes the advantages of the invention clear; the inventive samples are improved in terms of ∈ with no drop of Q.

Example 2

Samples (of 1 mm×1 mm×100 mm) were prepared and estimated as in Example 1 with the exception that the polymer and ceramics were used at such weight ratios as indicated in Table 3, and a ceramic material (having an average grain diameter of 130 μm and fired at 1,350° C.: ceramics 2) was used as the ceramic dielectric material. However, the heat resistance to solder was estimated at 260° C.

Figure 1:
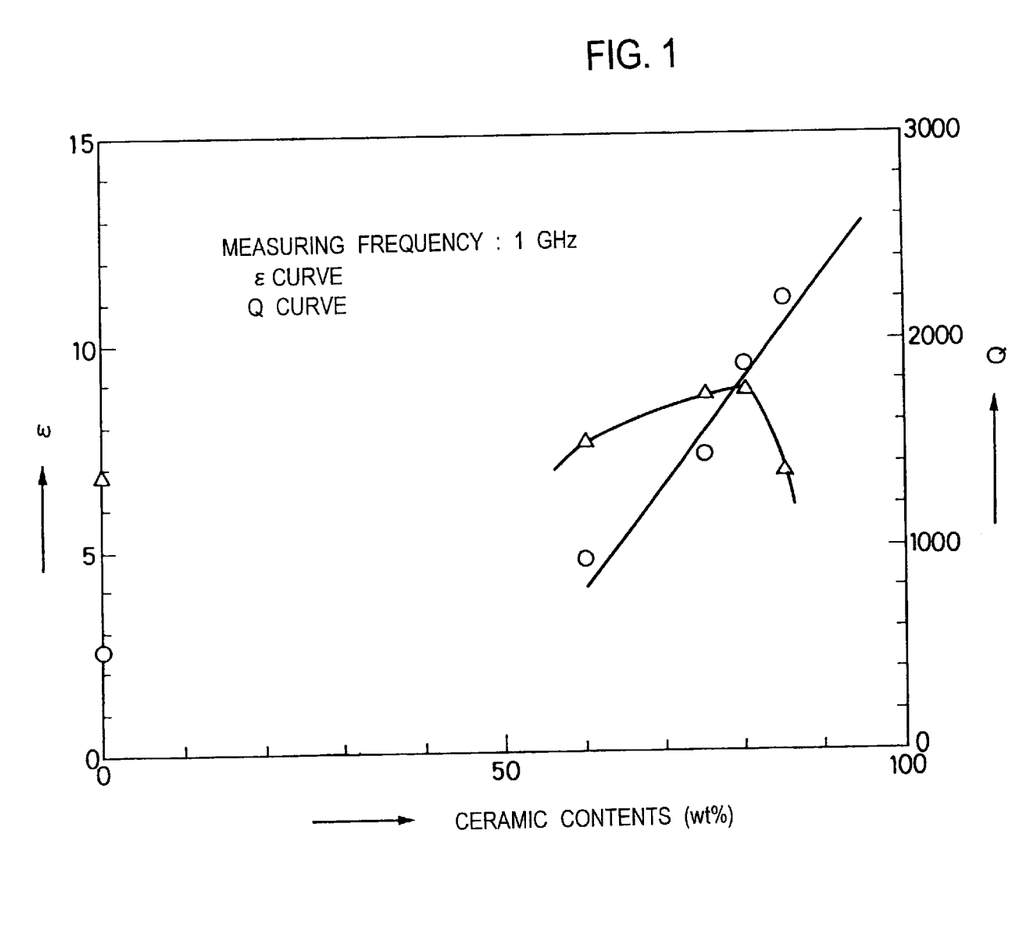
FIG. 1 is a graph showing the relations of ∈, and Q with respect to the content of high-frequency ceramics when the ceramics is used as a filler.

The results are set out in Table 3, and the relations of ∈, and Q with respect to the ceramic content including 0% by weight are shown in FIG. 1.

TABLE 3

| Sample No. | Weight Ratio of Polymer A /Ceramics 2 | ∈ 1 GHz/2 GHz/5 GHz | tan δ [×10$^{-3}$] (Q) 1 GHz/2 GHz/5 GHz | HRS 260° C. |
|---|---|---|---|---|
| 21 | 15/85 | 10.999/10.898/10.283 | 0.7346(1362)/0.8086(1237)/1.074(932) | ○ |
| 22 | 20/80 | 9.395/9.160/8.683 | 0.5726(1747)/0.6388(1566)/0.5773(1732) | ○ |
| 23 | 25/75 | 7.198/7.154/7.065 | 0.5783(1730)/0.6276(1594)/0.7933(1261) | ○ |
| 24 | 40/60 | 4.647/4.588/4.275 | 0.6620(1511)/0.6439(1554)/0.7694(1300) | ○ |

HRS: Heat resistance to solder

Table 3 and FIG. 1 make the advatages of the invention clear, and indicate that ∈ increases with an increase in the content of the ceramic dielectric material.

Example 3

A sample was prepared as in Example 1 with the exception that polymer P of Synthesis Example 2 and the same ceramic dielectric material (fired at 900° C.) as in Example 1 were used at a polymer P/ceramics weight ratio of 15/85.

Also, a sample with no ceramics added thereto was prepared.

These samples were estimated as in Example 2. The results are set out in Table 4.

TABLE 2

| Sample No. | Weight Ratio of Polymer A /Ceramics 1 | ∈ 1 GHz/2 GHz/5 GHz/10 GHz | Tan δ [×10$^{-3}$] (Q) 1 GHz/2 GHz/5 GHz/10 GHz | HRS 200° C. | HRS 230° C. |
|---|---|---|---|---|---|
| 1 | 15/85 | 14.4/14.4/14.3 | 2.46(408)/2.27(440)/2.31(432) | ○ | ○ |
| 2 | 20/80 | 10.4/10.6/11.4 | 2.10(477)/2.07(484)/2.03(492) | ○ | ○ |
| 3 | 25/75 | 8.0/8.08/8.64 | 1.79(560)/1.76(569)/1.77(566) | ○ | ○ |
| 4 | 100/0 | 2.47/2.47/2.43/2.37 | 0.73(1377)/0.51(1954)/0.56(1789)/0.66(1510) | ○ | ○ |
| 5* | 20/80 | 10.15/10.19/10.27/10.31 | 1.92(522)/1.83(546)/1.71(585)/2.00(500) | ○ | ○ |

HRS: Heat resistance to solder
*:1.0 mm × 0.8 mm × 100 mm

TABLE 4

| Sample No. | Weight Ratio of Polymer F /Ceramics 1 | ξ 1 GHz/2 GHz/5 GHz | tan δ [× 10⁻³] (Q) 1 GHz/2 GHz/5 GHz | HRS 260° C. |
|---|---|---|---|---|
| 31 | 15/85 | 11.186/11.210/11.168 | 1.035(966)/1.091(917)/1.436(697) | ○ |
| 32 | 100/0 | 2.243/2.238/2.221 | 0.5785(1729)/0.5725(1748)/0.6421(1557) | ○ |

HRS: Heat resistance to solder

A composite dielectric composition corresponding to sample No. 31 was hot-pressed at 220° C. and 500 Kg/cm² by a hot-pressing machine (made by Ueshima Machine Co., Ltd.) to prepare a pressed product of 10 mm×10 mm×200 mm with a center Cu line (of 1.37 mm in diameter) provided thereon. A trial delay line was prepared by plating the surface of the product with Cu at a thickness of 0.3 μm by means of electroless plating, and plating the plated Cu with Cu at a further thickness of 10 to 12 μm by means of electroplating. Another trial delay line was prepared using a Cu line of 0.37 mm in diameter as the center line. All these delay lines were found to operate normally.

Example 4

A sample was prepared and estimated as in Example 2 with the exception that polymer P of Synthesis Example 2 and the same ceramic dielectric material (fired at 1,350° C.) as in Example 2 were used at a polymer P/ceramics weight ratio of 15/85. The results are set out in Table 5.

TABLE 5

| Sample No. | Weight Ratio of Polymer P /Ceramics 2 | ξ 1 GHz/2 GHz/5 GHz | tan δ [×10⁻³] (Q) 1 GHz/2 GHz/5 GHz | HRS 260° C. |
|---|---|---|---|---|
| 41 | 15/85 | 9.832/7.878/11.077 | 0.6621(1511)/0.6856(1458)/1.0543(948) | ○ |

HRS: Heat resistance to solder

Table 5 makes the advantages of the invention clear.

A composite dielectric composition corresponding to sample No. 41 was hot-pressed at 220° C. and 500 Kg/cm² by a hot-pressing machine (made by Ueshima Machine Co., Ltd.) to prepare a pressed product of 20 mm×20 mm×20 mm. This was found to have practically acceptable dielectric resonator performance.

Example 5

A delay line sample was prepared as in Example 3 with the exception of using a composite dielectric material composition corresponding to sample No. 41 of Example 4. This sample was found to operate normally at practical levels.

Examples 6–10

Using a metering feeder, the graft copolymer (A) obtained in Synthesis Example 1 and glass fibers (GF-1), (GF-2), and (GF-3) were supplied at such ratios as indicated in Table 6 to a co-axial twin-screw extruder preset at a cylinder temperature of 210° C. and a screw diameter of 30 mm for extrusion, followed by granulation. Each of the obtained pellets was formed as in Synthesis Example 1, and estimated. The results are set out in Table 6.

Example 11

The graft copolymer (A) obtained in Synthesis Example 1 was reduced by freeze pulverization to powders, which were spread uniformly over a glass cloth (GC) and then hot-pressed at 220° C. by means of a hot-pressing machine (made by Ueshima Machine Co., Ltd.) to prepare a sheet of 10 cm×10 cm×0.01 cm. Ten such sheets were stacked together, and then hot-pressed at 220° C. to prepare an electrical insulating material test piece of 10 cm×10 cm×0.1 cm.

Sixty such sheets were stacked together, and then hot-pressed at 220° C. to prepare a sheet of 10 cm×10 cm×0.6 cm, out of which a test piece of 13 mm×65 mm×6 mm was cut for the same estimation as in Synthesis Example 1. The results are set out in Table 6 wherein:

GF-1 stands for an E glass chopped strand CS03MA411 (having an average fiber length of 3,000 μm and made by Asahi Fiber Glass Co., Ltd.), GF-2 stands for an E glass milled fiber MF06MW2-20 (having an average fiber length of 30 to 100 μm and made by Asahi Fiber Glass Co., Ltd.), GF-3 stands for an E glass powder P325 (having an average particle diameter of 40 μm and made by Asahi Fiber Glass Co., Ltd.), and GC stands for an E glass cloth MS100 (made by Asahi Fiber Glass Co., Ltd.).

TABLE 6

| Example | 6 | 7 | 8 | 9 | 10 | 11 |
|---|---|---|---|---|---|---|
| Graft copolymer | A | A | A | A | A | A |
| Type of Filler | GF-A | GF-A | GF-A | GF-B | GF-C | GC |
| Proportion of Filler (parts by weight per 100 parts by weight of resin) | 5 | 40 | 100 | 40 | 40 | 40 |
| Volume resistivity (×10¹⁶ Ω · cm) | 3.0 | 2.7 | 3.2 | 3.0 | 2.9 | 3.1 |
| Dielectric breakdown strength (KV/mm) | 37 | 39 | 41 | 41 | 38 | 40 |
| Dielectric constant | | | | | | |
| 1 GHz | 2.25 | 2.86 | 3.91 | 2.87 | 2.88 | 2.84 |
| 2 GHz | 2.36 | 2.83 | 3.84 | 2.86 | 2.81 | 2.81 |
| 5 GHz | 2.33 | 2.85 | 3.87 | 2.86 | 2.85 | 2.83 |
| 10 GHz | 2.31 | 2.81 | 3.82 | 2.79 | 2.80 | 2.82 |

TABLE 6-continued

| Example | 6 | 7 | 8 | 9 | 10 | 11 |
|---|---|---|---|---|---|---|
| Dielectric loss tangent ($\times 10^{-3}$) | | | | | | |
| 1 GHz | 1.05 | 2.08 | 3.97 | 2.26 | 2.20 | 2.15 |
| 2 GHz | 1.08 | 2.04 | 3.87 | 2.31 | 2.16 | 2.18 |
| 5 GHz | 1.03 | 1.97 | 3.91 | 2.24 | 2.11 | 2.13 |
| 10 GHz | 0.98 | 2.01 | 3.91 | 2.21 | 2.14 | 2.11 |
| Heat resistance to solder | | | | | | |
| 200° C. | ○ | ○ | ○ | ○ | ○ | ○ |
| 230° C. | ○ | ○ | ○ | ○ | ○ | ○ |
| 260° C. | Δ | ○ | ○ | Δ | Δ | ○ |
| Izod impact strength (Kg · cm/cm$^2$) | 9 | 6 | 4 | 6 | 7 | 6 |
| Coefficient of linear expansion (ppm/° C.) | 210 | 110 | 60 | 120 | 120 | 40 |
| Adhesion to metal | ○ | ○ | ○ | ○ | ○ | ○ |
| Water absorption (%) | <0.03 | <0.03 | <0.06 | <0.03 | <0.03 | <0.03 |
| Formability | good | good | good | good | good | good |
| Degree of crosslinking (solubility) | SW | SW | SW | SW | SW | SW |

SW: swollen

Examples 12–16

Using a metering feeder, the graft copolymer (P) obtained in Synthesis Example 2 and glass fibers (GF-1), (GF-2), and (GF-3) were supplied at such ratios as indicated in Table 7 to a co-axial twin-screw extruder preset at a cylinder temperature of 210° C. and a screw diameter of 30 mm for extrusion, followed by granulation. Each of the obtained pellets was formed as in Synthesis Example 1, and estimated. The results are set out in Table 7.

Example 17

The graft copolymer (P) obtained in Synthesis Example 2 and glass cloth (GC) were used as in Example 11 to prepare sheets and test pieces for estmation. The results are set out in Table7 wherein:

GF-1 stands for an E glass chopped strand CS03MA411 (having an average fiber length of 3,000 μm and made by Asahi Fiber Glass Co., Ltd.), GF-2 stands for an E glass milled fiber MF06MW2-20 (having an average fiber length of 30 to 100 μm and made by Asahi Fiber Glass Co., Ltd.), GF-3 stands for an E glass powder P325 (having an average particle diameter of 40 μm and made by Asahi Fiber Glass Co., Ltd.), and GC stands for an E glass cloth MS100 (made by Asahi Fiber Glass Co., Ltd.).

TABLE 7

| Example | 12 | 13 | 14 | 15 | 16 | 17 |
|---|---|---|---|---|---|---|
| Graft copolymer | P | P | P | P | P | P |

TABLE 7-continued

| Example | 12 | 13 | 14 | 15 | 16 | 17 |
|---|---|---|---|---|---|---|
| Type of Filler | GF-1 | GF-1 | GF-1 | GF-2 | GF-3 | GC |
| Proportion of Filler (parts by weight per 100 parts by weight of resin) | 5 | 40 | 100 | 40 | 40 | 40 |
| Volume resistivity ($\times 10^{16}$ Ω · cm) | 3.1 | 3.3 | 2.8 | 2.6 | 2.7 | 2.8 |
| Dielectric breakdown strength (KV/mm) | 37 | 39 | 41 | 41 | 38 | 40 |
| Dielectric constant | | | | | | |
| 1 GHz | 2.30 | 2.93 | 3.95 | 2.88 | 2.86 | 2.87 |
| 2 GHz | 2.31 | 2.87 | 3.91 | 2.84 | 2.87 | 2.85 |
| 5 GHz | 2.35 | 2.83 | 3.88 | 2.87 | 2.83 | 2.81 |
| 10 GHz | 2.27 | 2.83 | 3.83 | 2.81 | 2.85 | 2.83 |
| Dielectric loss tangent ($\times 10^{-3}$) | | | | | | |
| 1 GHz | 1.01 | 2.07 | 3.89 | 2.11 | 2.15 | 2.10 |
| 2 GHz | 1.12 | 2.07 | 3.92 | 2.07 | 2.13 | 2.11 |
| 5 GHz | 1.06 | 2.04 | 3.90 | 2.04 | 2.13 | 2.08 |
| 10 GHz | 1.04 | 2.03 | 3.90 | 2.05 | 2.10 | 2.10 |
| Heat resistance to solder | | | | | | |
| 200° C. | ○ | ○ | ○ | ○ | ○ | ○ |
| 230° C. | ○ | ○ | ○ | ○ | ○ | ○ |
| 260° C. | ○ | ○ | ○ | ○ | ○ | ○ |
| Izod impact strength (Kg · cm/cm$^2$) | 10 | 5 | 3 | 6 | 5 | 5 |
| Coefficient of linear expansion (ppm/° C.) | 140 | 80 | 40 | 90 | 90 | 20 |
| Adhesion to metal | ○ | ○ | ○ | ○ | ○ | ○ |
| Water absorption (%) | <0.03 | <0.03 | <0.06 | <0.03 | <0.03 | <0.03 |
| Formability | good | good | good | good | good | good |
| Degree of crosslinking | IN | IN | IN | IN | IN | IN |

IN: insoluble

Examples 18–23

Using a metering feeder, the graft copolymer (P) obtained in Synthesis Example 2 and quartz, steatite, clay, wollastonite, boron nitride, and magnesium borate were supplied at such ratios as indicated in Table 8 to a co-axial twin-screw extruder preset at a cylinder temperature of 210° C. and a screw diameter of 30 mm for extrusion, followed by granulation. Each of the obtained pellets was formed as in Synthesis Example 1, and estimated. The results are set out in Table 8 wherein:

Qu is a melt-pulverized natural quartz having an average diameter of 0.3 μm,

St is a steatite pulverized in a sheet-like form,

Cl is a clay having an average particle diameter of 0.3 μm,

Wo is an acicular wollastonite,

BN is a hexagonal boron nitride pulverized in a sheet-like form, and

MB is a magnesium borate whisker having an average fiber length of 10 to 20 μm.

TABLE 8

| Example | 18 | 19 | 20 | 21 | 22 | 23 |
|---|---|---|---|---|---|---|
| Graft copolymer | P | P | P | P | P | P |
| Type of Filler | Qu | St | Cl | Wo | BN | MB |
| Proportion of Filler (parts by weight per 100 parts by weight of resin) | 40 | 40 | 40 | 40 | 40 | 40 |
| Volume resistivity ($\times 10^{16}$ Ω · cm) | 2.7 | 3.8 | 3.1 | 2.6 | 2.3 | 4.1 |
| Dielectric breakdown strength (KV/mm) | 27 | 31 | 33 | 41 | 37 | 36 |
| Dielectric constant | | | | | | |
| 1 GHz | 2.71 | 2.75 | 2.66 | 2.88 | 2.75 | 2.75 |
| 2 GHz | 2.67 | 2.73 | 2.63 | 2.84 | 2.77 | 2.71 |
| 5 GHz | 2.65 | 2.77 | 2.61 | 2.87 | 2.79 | 2.76 |
| 10 GHz | 2.66 | 2.71 | 2.63 | 2.81 | 2.72 | 2.73 |
| Dielectric loss tangent ($\times 10^{-3}$) | | | | | | |
| 1 GHz | 8.75 | 1.78 | 2.16 | 6.85 | 7.85 | 9.20 |
| 2 GHz | 8.86 | 1.66 | 2.15 | 6.81 | 7.83 | 9.08 |
| 5 GHz | 8.77 | 1.68 | 2.08 | 6.82 | 7.81 | 9.02 |
| 10 GHz | 8.64 | 1.75 | 2.04 | 6.81 | 7.76 | 9.11 |
| Heat resistance to solder | | | | | | |
| 200° C. | ◯ | ◯ | ◯ | ◯ | ◯ | ◯ |
| 230° C. | ◯ | ◯ | ◯ | ◯ | ◯ | ◯ |
| 260° C. | ◯ | ◯ | ◯ | ◯ | ◯ | ◯ |
| Izod impact strength (Kg · cm/cm$^2$) | 6 | 5 | 5 | 6 | 5 | 7 |
| Coefficient of linear expansion (ppm/° C.) | 70 | 70 | 60 | 60 | 70 | 60 |
| Adhesion to metal | ◯ | ◯ | ◯ | ◯ | ◯ | ◯ |
| Water absorption (%) | <0.03 | <0.03 | <0.06 | <0.03 | <0.03 | <0.03 |
| Formability | good | good | good | good | good | good |
| Degree of cross-linking | IN | IN | IN | IN | IN | IN |

The results set out in Tables 1 to 8 make the advantages of the invention clear. It is found that by the incorporation of the filler (II) in the heat-resistant, low-dielectric polymeric material, any desired dielectric constant can be selected from a relatively wide range, and the heat resistance to solder and the coefficient of linear expansion are improved in a well-balanced state while low dielectric loss tangent, Izod impact strength and adhesion to metals are maintained.

ADVANTAGES OF THE INVENTION

As detailed in the foregoing, the heat-resistant, low-dielectric resin composition of the invention can have any desired dielectric constant selected from a relatively wide range, is low in terms of dielectric loss tangent, excellent in heat resistance, low in terms of the coefficient of linear expansion, and high in terms of processabilities such as formability and mechanical strength, and shows excellent adhesion to metals, etc. Thus, the resin composition of the invention is especially useful for applications where electrical insulation, heat resistance, and mechanical properties are needed, e.g., for printed wiring boards, and parts for computers, and can provide substrates or electronic parts having improved performance.

What is claimed is:

1. A composite dielectric material composition comprising a heat-resistant, low-dielectric polymeric material (I) that is a resin composition comprising one or two or more resins having a weight-average absolute molecular weight of at least 1,000, wherein the sum of carbon atoms and hydrogen atoms in all of said resins in said dielectric material composition is at least 99% of the total number of atoms in all of said resins, and a filler (II), wherein said heat-resistant, low-dielectric polymeric material is a copolymer in which a non-polar α-olefin base (co)polymer segment and/or a non-polar conjugated diene base (co)polymer segment are chemically combined with a vinyl aromatic (co)polymer segment containing a monomer of divinylbenzene, and is a thermoplastic resin which shows a multi-phase structure wherein a dispersion phase formed by one segment is finely dispersed in a continuous phase formed by another segment, and wherein said heat-resistant, low-dielectric polymeric material in pulverized form is insoluble in xylene of 120° C.

2. The composite dielectric material composition according to claim 1, which is a copolymer with said non-polar α-olefin base (co)polymer segment chemically combined with said vinyl aromatic (co)polymer segment.

3. The composite dielectric material composition according to claim 1, wherein said heat-resistant, low-dielectric polymeric material further comprises a non-polar αolefin base (co)polymer containing a monomer of 4-methylpentene-1.

4. The composite dielectric material composition according to claim 1, which has a dielectric constant of at least 1.0 and a Q value of at least 100 in a high-frequency band of at least 1 MHz.

5. The composite dielectric material composition according to claim 1, wherein said filler is in a fibrous state.

6. The composite dielectric material composition according to claim 1, wherein said filler is a non-fibrous state.

7. The composite dielectric material composition according to claim 1, wherein said filler is a high-frequency ceramic dielectric material.

8. The composite dielectric material composition according to claim 7, wherein said high-frequency ceramic dielectric material is a titanium-barium-neodymium base material and/or a lead-calcium base material, and accounts for 50 to 95% by weight of said composite dielectric material composition.

9. A film of at least 20 μm in thickness, which is obtained using the composite dielectric material composition according to claim 1.

10. A substrate obtained by lamination of films, each according to claim 9.

11. A substrate obtained by coating a surface of a metal sheet with the composite dielectric material composition according to claim 1.

12. The film according to claim 9, which is used in a high-frequency band of at least 1 MHz.

13. The substrate according to claim 10, which is used in a high-frequency band of at least 1 MHz.

14. An electronic part, which is obtained using the composite dielectric material composition according to claim 1 and used in a high-frequency band of at least 1 MHz.

15. An article obtained by forming the composite dielectric material composition according to claim 1 into a given shape.

16. The composite dielectric material composition according to claim 1, wherein the monomer of divinyl benzene is present in an amount of at least 1% by weight of the vinyl aromatic (co)polymer segment.

17. The composite dielectric material composition according to claim 16, wherein the amount of said monomer of divinyl benzene is no greater than 90% by weight of said vinyl aromatic (co)polymer segment.

* * * * *